United States Patent
Duesman et al.

(10) Patent No.: US 6,872,509 B2
(45) Date of Patent: Mar. 29, 2005

(54) APPARATUS AND METHODS FOR PHOTOLITHOGRAPHIC PROCESSING

(75) Inventors: Kevin Duesman, Boise, ID (US); Randal Chance, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 144 days.

(21) Appl. No.: 10/213,034

(22) Filed: Aug. 5, 2002

(65) Prior Publication Data

US 2004/0023137 A1 Feb. 5, 2004

(51) Int. Cl.⁷ .................................................. G03F 7/20
(52) U.S. Cl. ...................................... 430/311; 430/396
(58) Field of Search ................................ 430/311, 313, 430/394, 396

(56) References Cited

U.S. PATENT DOCUMENTS

| | | | |
|---|---|---|---|
| 5,194,344 A | 3/1993 | Cathey, Jr. et al. | 430/5 |
| 5,194,346 A | 3/1993 | Rolfson et al. | 430/5 |
| 5,308,741 A | 5/1994 | Kemp | 430/312 |
| 5,384,219 A | 1/1995 | Dao et al. | 430/5 |
| 5,851,704 A | 12/1998 | Pierrat | 430/5 |
| 5,906,910 A | 5/1999 | Nguyen et al. | 430/311 |
| 5,908,718 A | 6/1999 | Ishida et al. | 430/5 |
| 6,498,105 B1 * | 12/2002 | Kim | 438/700 |
| 2002/0025019 A1 * | 2/2002 | Amemiya et al. | 378/34 |
| 2002/0177076 A1 * | 11/2002 | Komatsu et al. | 430/311 |

* cited by examiner

Primary Examiner—Kathleen Duda
(74) Attorney, Agent, or Firm—Dorsey & Whitney LLP

(57) ABSTRACT

Photolithographic processing apparatus and methods are disclosed. In one embodiment, a method of photolithographically patterning a surface of a substrate includes forming a photoreactive layer on the surface of the substrate, transmitting light through a first patterning portion of a first photolithographic mask to expose a first patterned portion of the photoreactive layer, transmitting light through a second patterning portion of a second photolithographic mask to expose a second patterned portion of the photoreactive layer. In an alternate embodiment, transmitting light through the first patterning portion of the first photolithographic mask is performed simultaneously with transmitting light through the second patterning portion of the second photolithographic mask. In a further embodiment, the light being transmitted through the second patterning portion of a second photolithographic mask has already been transmitted through a first transparent portion of the first photolithographic mask.

15 Claims, 4 Drawing Sheets

APPARATUS AND METHODS FOR PHOTOLITHOGRAPHIC PROCESSING

TECHNICAL FIELD

The present invention relates to photolithography, and more particularly, to apparatus and methods for photolithographic processing using first and second masks to pattern a photoreactive layer.

BACKGROUND OF THE INVENTION

Fabricating microelectronic devices typically includes forming features on selected layers of a semiconductor wafer using photolithography. Individual features are often formed by using a photolithographic reticle or mask to project a selected pattern onto a layer of photoreactive material, and then removing selected portions of the pattern during subsequent processing steps. Photolithographic masks may be used in the fabrication of virtually any type of microelectronic device, including memory devices (DRAMs, SLDRAMs, RDRAMs, etc.), field emission displays, processor chips, and many other types of semiconductor devices.

FIG. 1 shows a typical apparatus 10 for patterning semiconductor wafers using photolithography. The apparatus 10 includes a light source 12 that directs light 13 through a condenser 14 onto a reticle 18. The condenser 14 collimates and filters the light to a desired wavelength. The light passes through the reticle 18 and then through a lens system 20 which focuses the light onto a semiconductor wafer 24 that has been coated with a layer of photoreactive material (or photoresist) 26. The wafer 24 is supported on a moveable stage 30.

FIG. 2 shows a representative light intensity pattern 32 on the photoreactive layer 26 of FIG. 1. As is well known in the art, the reticle 18 creates the light intensity pattern 32 of relatively light and dark areas 34, 36 on an exposed portion 28 corresponding to the features that are to be formed in the photoreactive layer 26. After each portion 28 is exposed, the position of the wafer 24 is incrementally advanced by "stepping" or moving the stage 30 supporting the wafer 24. Another portion 28 is then exposed having an identical pattern to the first exposed portion 28, and the stage 30 is incrementally advanced until all of the wafer 24 has been exposed.

If the photoreactive layer 26 is a "negative resist" layer, the dark or shadow pattern produced by the reticle 18 corresponds to the negative of the features that are to be formed in the resist 26. Conversely, for a "positive resist" layer (FIG. 2), the dark pattern corresponds directly to the features that are to be formed. In either case, after the photoreactive layer 26 has been exposed, it is processed in a conventional manner to remove the brightly-illuminated portions in the case of a positive resist material or unexposed or dark portions in the case of negative resist material. Known photolithographic apparatus and processes of the type shown in FIGS. 1 and 2 are disclosed, for example, in U.S. Pat. No. 5,384,219 issued to Dao et al., U.S. Pat. No. 5,906,910 issued to Nguyen et al., and U.S. Pat. No. 5,308,741 issued to Kemp.

Although desirable results have been achieved using conventional photolithographic apparatus and processes, some drawbacks exist. For example, during research and development of new semiconductor designs, it is often desirable to conduct trial-and-error studies in order to optimize a design. Such trial-and-error studies involve introducing minor variations into the design, and then testing the design to determine which variation provides optimal performance. For each new design of the trial-and-error study, a new reticle 18 is constructed.

In the case of memory circuits, trial-and-error studies are commonly used to investigate design variations in a so-called "periphery" portion of the memory circuit containing the access circuitry necessary for transmitting control and data signals to, and receiving signals from, the individual memory elements of the memory array. The region of the periphery is typically a fraction of the total patterned area of a reticle, with the memory array occupying the majority of the patterned area. Additionally, the patterning of the periphery region is not nearly as dense as in the memory array because there is not the same need for small feature sizes. Thus, in the case of memory circuits, a relatively large portion of each new reticle 18, which is associated with the array of memory elements, remains unchanged between successive trial-and-error tests, while a relatively small portion of each new reticle, which is associated with the periphery portion in which design variations are systematically conducted, is modified. In many situations, only minor modifications are made in the periphery, however, an entirely new reticle is made.

It is generally the case that the cost of a new reticle increases with the complexity and density of the pattern. As previously mentioned, the patterning of the periphery is not as dense as for the memory array, which is not that complicated, but much denser than for the periphery. Thus, relatively speaking, the portion of the costs of making a new reticle that are attributed to the pattern of the memory array is considerably greater than the portion of the costs attributed to the pattern of the periphery. Although minor modifications may be made in the periphery, an entirely new reticle is still made. Because the cost of fabricating each new photolithographic reticle 18 is relatively high, the overall cost of trial-and-error studies can be exorbitant before a satisfactorily optimized design is achieved.

SUMMARY OF THE INVENTION

The present invention is directed to apparatus and methods for photolithographic processing. In one aspect, a method of photolithographically patterning a surface of a substrate comprises forming a photoreactive layer on the surface of the substrate, transmitting light through a patterning portion of a first photolithographic mask to expose a first patterned portion of the photoreactive layer, transmitting light through a patterning portion of a second photolithographic mask to expose a second patterned portion of the photoreactive layer, and removing at least part of the first and second patterned portions of the photoreactive layer. Because the resulting pattern is produced using first and second photolithographic masks, design variations in the resulting pattern may be more easily and economically investigated by changing and re-fabricating one of the masks rather than doing the same for a single mask that produces the entire pattern. One mask can be used for relatively simple patterns, and another mask, or masks, can be used for more complicated and dense patterns for the same photoreactive layer. Having a new reticle made for the relatively simple patterns will cost considerably less than for fabricating an entirely new reticle for the photoreactive layer.

In an alternate aspect, transmitting light through the first patterning portion of the first photolithographic mask is performed simultaneously with transmitting light through the second patterning portion of the second photolithographic mask. In a further aspect, the light being transmitted through the second patterning portion of a second photolithographic mask has already been transmitted through a first transparent portion of the first photolithographic mask. In yet another aspect, a method further includes blocking a first unexposed portion of the photoreactive layer from being exposed to light with a first blocking portion of the first photolithographic mask simultaneously with transmitting light through the first patterning portion of the first photolithographic mask.

As is conventional in the field of integrated circuit representation, the lateral sizes and thicknesses of the various layers are not drawn to scale, and portions of the various layers may have been arbitrarily enlarged or reduced to improve drawing legibility.

DETAILED DESCRIPTION OF THE INVENTION

The present description is generally directed toward novel apparatus and methods for photolithographic processing. Many specific details of certain embodiments of the invention are set forth in the following description and in FIGS. 3–12 to provide a thorough understanding of such embodiments. One skilled in the art will understand, however, that the present invention may have additional embodiments, or that the present invention may be practiced without several of the details described in the following description.

Figure 3A:
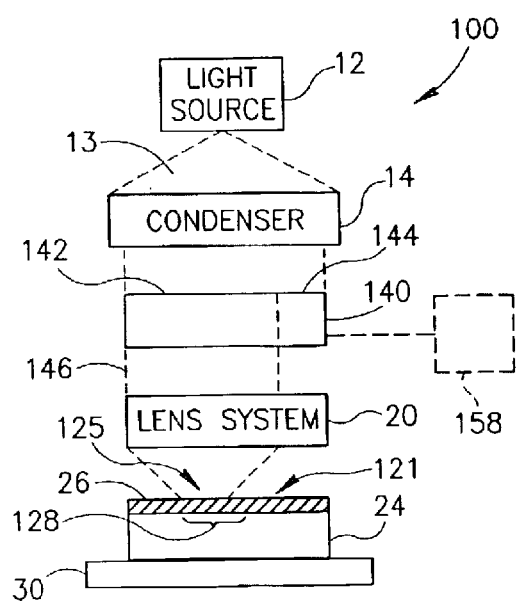
FIGS. 3A and 3B are side elevational views of a photolithographic apparatus in accordance with an embodiment of the invention.
Figure 3B:
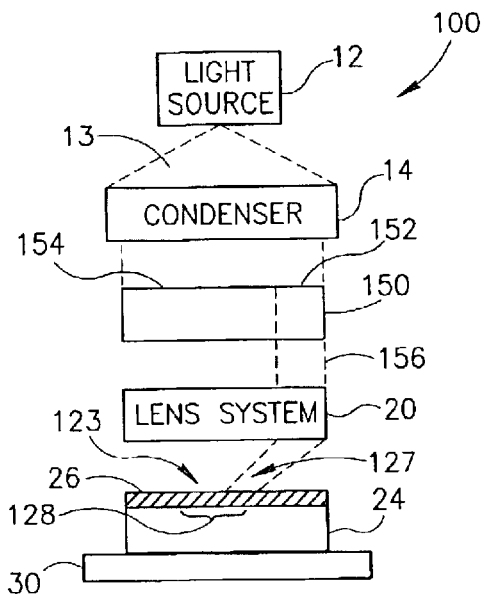

FIGS. 3A and 3B are side elevational views of a photolithographic apparatus 100 in accordance with an embodiment of the invention. In this embodiment, the photolithographic apparatus 100 includes a first reticle 140 (FIG. 3A) adapted to create a first light intensity pattern 125 on a photoreactive (or photoresist) layer 26, and a second reticle 150 (FIG. 3B) adapted to create a second light intensity pattern 127 on the photoreactive layer 26. Together, the first and second reticles 140, 150 are used to photolithographically pattern an exposed portion 128 of the photoreactive layer 26.

The photolithographic apparatus 100 shown in FIGS. 3A and 3B further includes a light source 12 that directs light 13 through a condenser 14 and onto the reticles 118, 119, and a lens system 20 that focuses the light being transmitted through the reticles 118, 119 onto the photoreactive layer 26 formed on a wafer 24. The wafer 24 is supported on a moveable stage 30. Those skilled in the art will appreciate that the term "light," as used herein, may mean any form of electromagnetic radiation, whether from the visible, infrared, or ultraviolet portions of the spectrum.

As further shown in FIG. 3A, the first reticle 140 includes a patterning portion 142 and a blocking portion 144. The patterning portion 142 is adapted to transmit a first portion 146 of the incident light 13, while the blocking portion 144 does not transmit any light through the first reticle 140. Similarly, as shown in FIG. 3B, the second reticle 150 includes a patterning portion 152 that transmits a second portion 156 of the incident light 13, and a blocking portion 154 that does not transmit light.

The first and second reticles 140, 150 may be formed using known materials and processes, including, for example, those materials and processes disclosed in U.S. Pat. No. 5,194,346 issued to Rolfson et al., U.S. Pat. No. 5,194,344 issued to Cathey et al., U.S. Pat. No. 5,851,704 issued to Pierrat, and U.S. Pat. No. 5,908,718 issued to Isheda et al. Suitable materials for forming the patterning portions 142, 152 include, but are not limited to, transparent or semi-transparent oxides and nitrides, such as silicon dioxide, silicon nitride, tetraethylorthosilicate (TEOS) based oxides, borophosphosilicate-glass (BPSG), phosphosilicate-glass (PSG), borosilicateglass (BSG), oxide-nitride-oxide (ONO), plasma enhanced silicon nitride, spin-on glass (SOG), or other suitable composite oxides and/or nitride materials. Opaque materials may be used on the patterning portions 142, 152 or the blocking portions 144, 154, including, for example, chrome, aluminum, nickel, carbon, or any other suitable opaque materials. Those skilled in the art will appreciate that the particular materials used to construct the first and second reticles 140, 150 may be selected based on the wavelength and/or the intensity of the incident light 13.

Figures 4, 5:
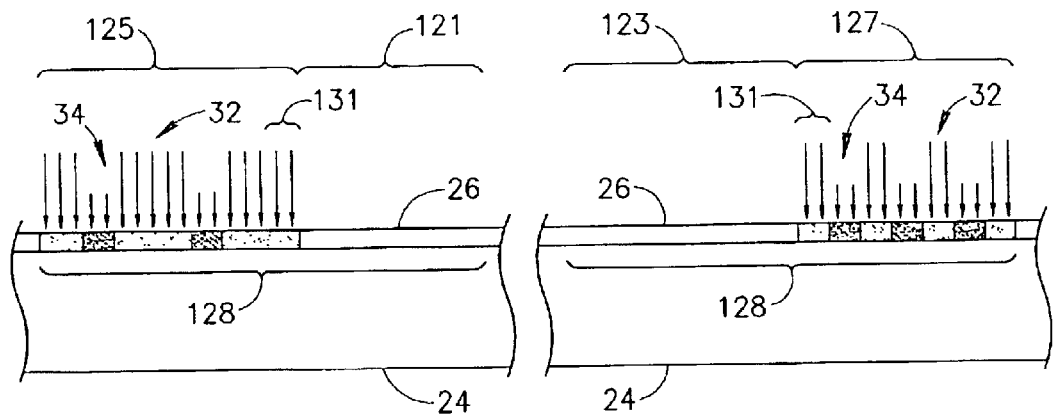
FIG. 4 is a side elevational view of a first representative light intensity pattern on a layer of photoresist of the photolithographic apparatus of FIG. 3A.
FIG. 5 is a side elevational view of a second representative light intensity pattern on the photoresist layer of FIG. 3B.

FIG. 4 is a side elevational view of the first light intensity pattern 125 formed by the first reticle 140 on the photoreactive layer 26, and FIG. 5 is a side elevational view of the second light intensity pattern 127 formed by the second reticle 150 on the photoreactive layer 26. As best shown in FIG. 4, the patterning portion 142 of the first reticle 140 produces the first light intensity pattern 125, and the blocking portion 144 of the first reticle 140 produces a blocked (or unexposed) region 121. Similarly, FIG. 5 shows that the patterning portion 152 of the second reticle 150 produces the second light intensity pattern 127, and the blocking portion 154 of the second reticle 150 produces another blocked region 123. The first and second light intensity patterns 125, 127 include relatively brightly-illuminated areas 32 and relatively dark areas 34.

In operation, the first and second reticles 140, 150 are sequentially employed in a two-step exposure process to create the first and second light intensity patterns 125, 127 on the photoreactive layer 26. First, the first reticle 140 is positioned between the light source 12 and the photoreactive layer 26 and the first light intensity pattern 125 is formed. Then, the first reticle 140 is removed and the second reticle 150 is positioned between the light source 12 and the photoreactive layer 26. The second light intensity pattern 127 is then formed on the photoreactive layer 26. The first and second reticles 140, 150 may be moved by hand, or alternately, by an automated robotic handler 158 (FIG. 3A). Suitable robotic handlers 158 include, for example, the commercially-available robotic aligners offered by SUSS MicroTec of Munich, Germany. It will be appreciated that although switching from the first reticle 140 to the second reticle 150 has been described with respect to patterning one device on a wafer, for the sake of fabrication efficiency, it will be more common for the first and second reticles 140, 150 to be switched after an entire wafer has been exposed, or after all of the wafers of a lot have been exposed using the first reticle 140.

In the embodiment shown in FIGS. 3 through 5, the first and second light intensity patterns 125, 127 include an overlap region 131 that is exposed by both the first and second reticles 140, 150. In alternate embodiments, however, the overlap region 131 may be eliminated, and the first and second light intensity patterns 125, 127 may simply abut at a specific location. Together, the first and second light intensity patterns 125, 127 combine to form the exposed portion 128 of the photoreactive layer 26 that may be incrementally repeated to systematically cover the entire wafer 24. It will be appreciated that although the patterning portions 142, 152 of the first and second reticles 140, 150 are shown and described as being adjacent, the patterning portions 142, 152 of the two reticles 140, 150 can also be interposed. For example, the blocking portion 144 of the first reticle 140 can be surrounded by the patterning portion 142 so that the second light intensity pattern 127 is formed the midst of the first light intensity pattern 125 resulting from the first reticle 140.

The photolithographic apparatus 100 advantageously reduces the cost of performing research and development studies of semiconductor designs. That is, the first reticle 140 may be used to form the first light intensity pattern 125 corresponding to a relatively large portion of the semiconductor design that is constant or unchanging. The second reticle 150 may be used to form the second light intensity pattern 127 corresponding to a relatively smaller portion of the design that is being changed or varied. To evaluate a new design involving a variation in the relatively smaller portion of the design, only the second reticle 150 needs to be changed, while the first reticle 140 remaining unchanged.

Figure 1:
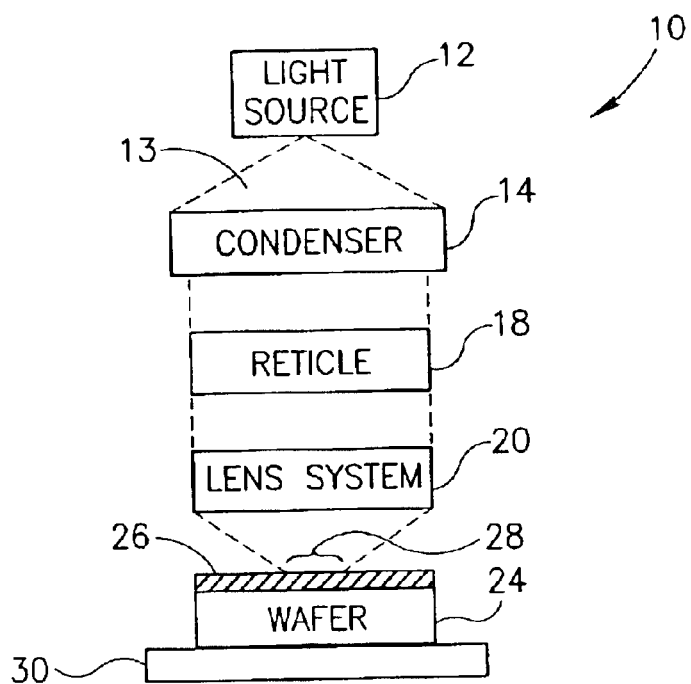
FIG. 1 is a schematic view of an apparatus for photolithographic patterning of semiconductor wafers in accordance with the prior art.
Figure 2:
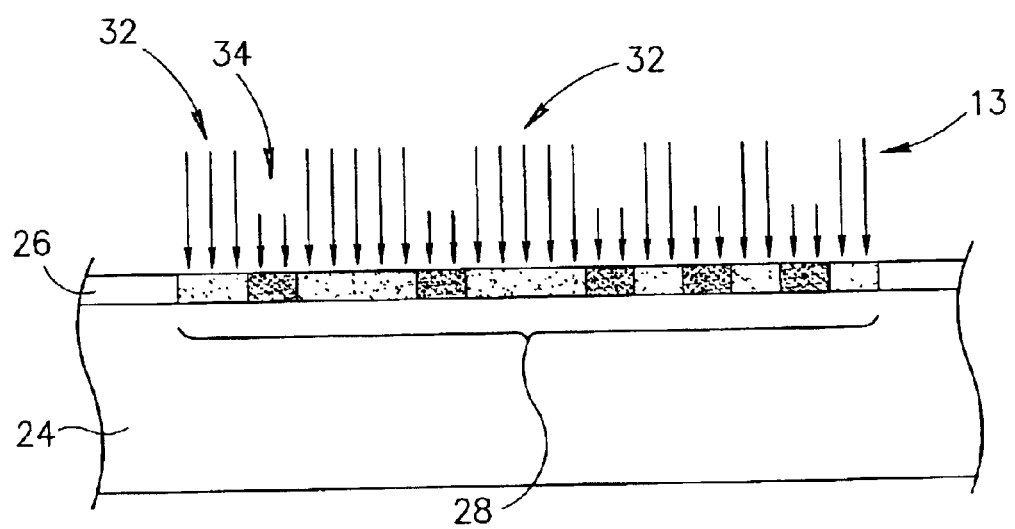
FIG. 2 is a side elevational view of a representative light intensity pattern on a layer of photoresist of the apparatus of FIG. 1.

As specifically applied to a memory device, complicated and dense patterns that are unlikely to be modified, such as for the memory array of a memory device, can be patterned using the first reticle 140. As previously discussed, such a first reticle 140 is relatively costly. Less dense regions having less complicated patterns, such as for the periphery region of a memory device, can be made using the second reticle 150. Such a second reticle 150 is much cheaper to replace than the first reticle 140. Thus, where modifications are to made only in the periphery during development studies, only the second reticle 150 needs to be replaced. The first reticle 140 can be reused since no changes were made. Consequently, although the initial costs of fabricating reticles 140,150 for a single layer of a device will be more costly compared to using a single reticle, the total costs for the reticles 140, 150 over the entire development cycle can be much less. Moreover, because the second reticle 150 will include less dense and less complicated patterns, in comparison with the single prior art reticle 18 (FIG. 1), the turn-around time required to fabricate a new second reticle 150 is less compared to the time necessary to fabricate a single reticle having the patterns for the single layer, and consequently, trial-and-error studies may be accomplished in a shorter period of time, in comparison with prior art photolithographic methods.

Figure 6:
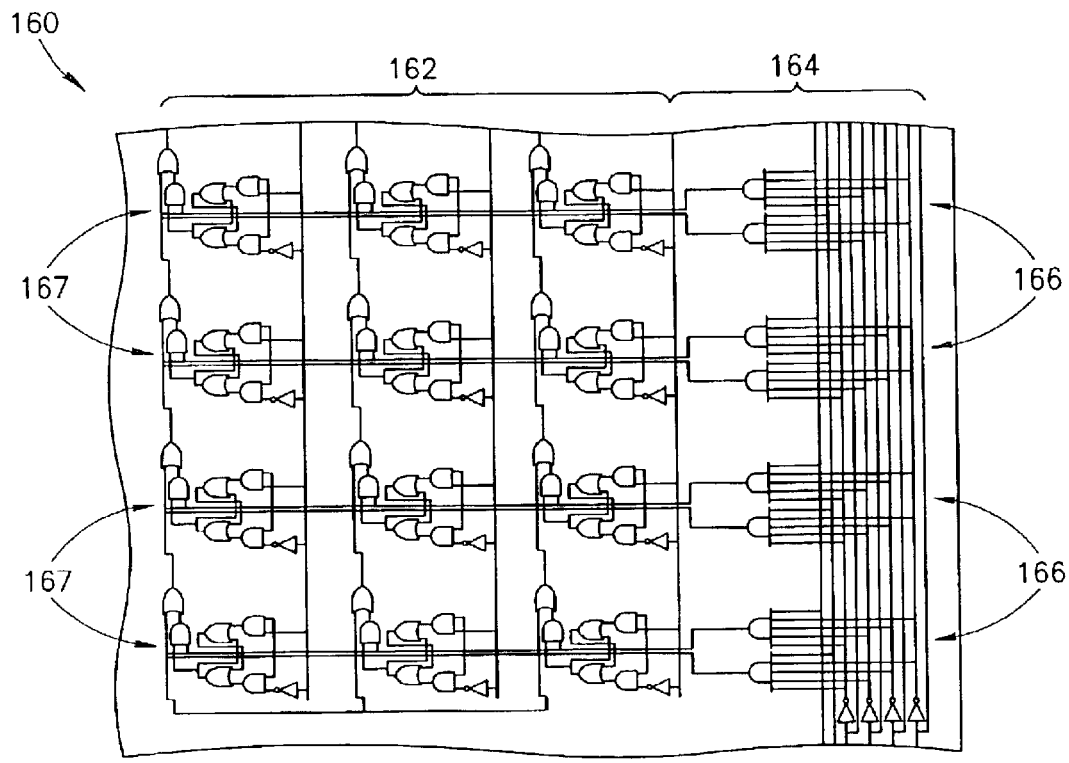
FIG. 6 is a top elevational view of a representative memory circuit formed using photolithographic apparatus of FIG. 3.

FIG. 6 is a top elevational view of a representative memory circuit 160 that may be formed using the photolithographic apparatus 100 of FIG. 3. The memory circuit 160 includes a memory array region 162 and a periphery region 164. A plurality of memory elements 167 are formed in the memory array region 162, and a plurality of access circuit elements 166 are formed in the periphery region 164. During research and development activities, the memory elements 167 in the memory array region 162 typically remain unchanged while design variations associated with the periphery region 164 are evaluated.

The inventive photolithographic apparatus 100 may be used to conduct research and development studies of memory devices that include memory circuits 160 of the type shown in FIG. 6. Specifically, the first reticle 140 may be used to create the first light intensity pattern 125 corresponding to the memory array region 162 of the memory circuit 160, and the second reticle 150 may be used to create the second light intensity pattern 127 corresponding to the periphery region 164 of the memory circuit 160. When trial-and-error studies of variations of the periphery region 162 are desired, only the second reticle 150 needs to be re-fabricated, while the first reticle 140 may be used over and over throughout the studies. The second reticle 150, by virtue of having fairly simple and less dense patterning than the first reticle 140, will be relatively inexpensive to replace.

Figure 7:
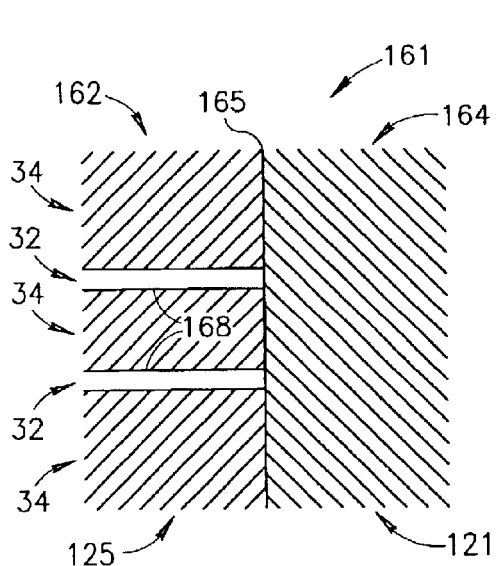
FIG. 7 is an enlarged, top elevational view of a portion of the memory circuit of FIG. 6 during a first processing step.
Figure 8:
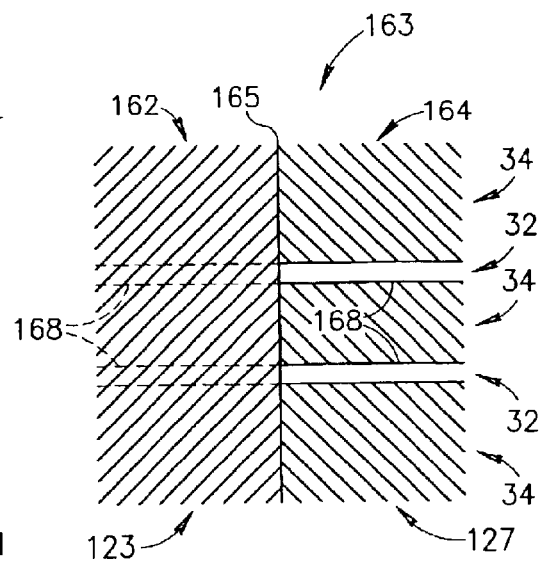
FIG. 8 is an enlarged, top elevational view of the portion of the memory circuit of FIG. 7 during a second processing step.
Figure 9:
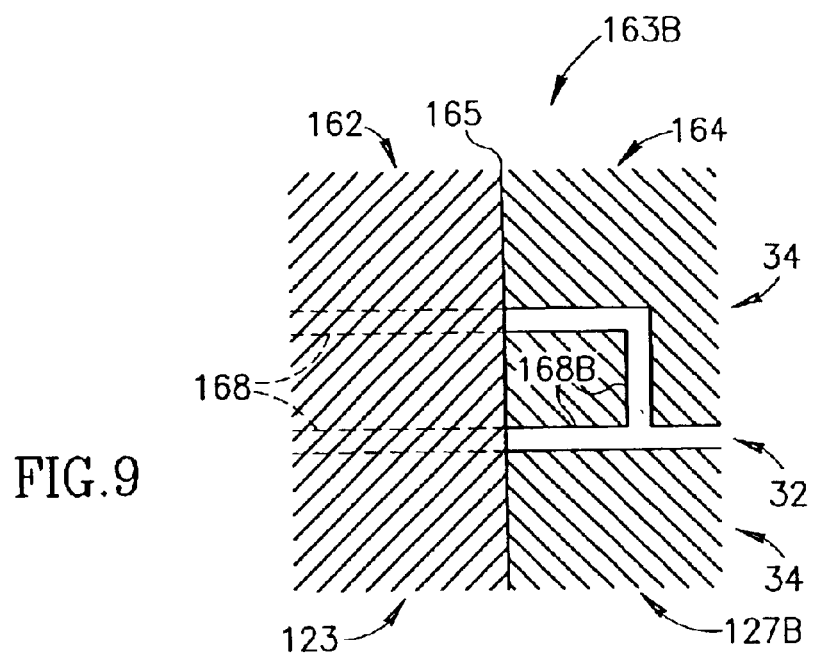
FIG. 9 is an enlarged, top elevational view of the portion of the memory circuit of FIG. 7 during an alternate second processing step.

A simplified example of a design variation in the periphery region 164 of the memory circuit 160 created using the photolithographic apparatus 100 is shown in FIGS. 7 through 9. FIG. 7 shows an enlarged, top elevational view of a portion of the memory circuit 160 of FIG. 6. The layer on which the photoreactive layer 26 is being formed is typically a conductive layer from which conductive interconnects are formed. Conventional methods for the formation of such a layer of material is well known in the art, and will not be discussed in detail herein for the sake of brevity. However, it will be appreciated that the present invention can be applied to other layers of a semiconductor device as well.

During a first processing step 161 when the photoreactive layer 26 is being exposed to light using the first reticle 140. In this view, the memory circuit 160 is shown along a boundary 165 between the memory array region 162 and the periphery region 164. The first light intensity pattern 125 created by the first reticle 140 includes relatively brightly-illuminated regions 32 and relatively dark regions 34. The blocked region 121 created by the blocking portion 144 of the first reticle 140 covers the periphery portion 164, thereby preventing the periphery portion 164 from being exposed.

FIG. 8 shows the enlarged portion of the memory circuit 160 of FIG. 7 during a second processing step 163. In this view, the second light intensity pattern 127 created by the second reticle 150 is projected onto the periphery region 164, and the blocked region 123 created by the blocking portion 154 of the second reticle 150 is cast onto the memory array region 162. The blocked region 123 covers those areas of the photoreactive layer 26 where the pair of conductive traces 168 were previously patterned. The second light intensity pattern 127 patterns the photoreactive layer 26 in the periphery region 164 to continue the conductive traces 168 along parallel paths into the periphery region 164. The photoreactive layer 26 is developed using conventional techniques to expose the surface of the conductive material beneath the relatively dark regions 34. The exposed surface is then etched using conventional techniques to form conductive traces 168.

FIG. 9 shows the enlarged portion of the memory circuit 160 of FIG. 7 during an alternate second processing step 163B following the first processing step 161. In this view, an alternate second light intensity pattern 127B is projected onto the periphery region 164 using an alternate second reticle 150B. The memory array region 162 remains covered by the blocking portion 154 of the alternate second reticle 150B. In this embodiment, the alternate second light intensity pattern 127B creates a brightly-illuminated area 32 on the photoreactive layer 26. As described previously with the second processing step 163A, the photoreactive layer 26 is developed using conventional techniques to expose the surface of the conductive material beneath the relatively dark regions 34. The exposed surface is then etched using conventional techniques to form a convergent conductive trace 168B that joins the conductive traces 168 from the memory array region 162 together in the periphery region 164.

In operation, a memory circuit 160 of a memory device may be formed using the first and second processing steps 161, 163 shown in FIGS. 7 and 8. The resulting memory device having the pair of parallel conductive traces 168 may then be tested and the performance of the memory device evaluated. After testing the memory device including the memory circuit 160 having the parallel conductive traces 168, it may be desirable to test a design variation having the conductive traces 168 converge into a single trace. An alternate second reticle 150B is then created, and an alternate embodiment of a memory device is using the first processing step (FIG. 7) and the alternate second processing step 163B (FIG. 9) to form a memory circuit having non-parallel conductive traces 168B in the periphery region. The alternate memory device may then be tested and evaluated in comparison with the first memory device, and the process may be repeated until the desired performance is achieved and the design of the memory device is optimized. Because the alternate second reticle 150B includes a relatively simple pattern, the cost of fabricating it will be relatively low and the time to make the alternate second reticle 150B will be relatively short. In this way, research and development studies of various memory device designs may be performed relatively quickly and economically compared with prior art photolithographic methods.

Alternate embodiments of photolithographic apparatus in accordance with the invention will be described below. In general, many of the components and operational characteristics of the alternate embodiments are the same as those described above with respect to the photolithographic apparatus 100. Therefore, in the following discussion, the reference numerals used to designate particular components will be similar to or the same as the reference numerals used to refer to the same or similar components of the previously-described photolithographic apparatus 100 embodiment. For purposes of clarity, and to avoid undue repetition, only the significantly different aspects or operational features of each alternate embodiment will be discussed in detail.

Figure 10:
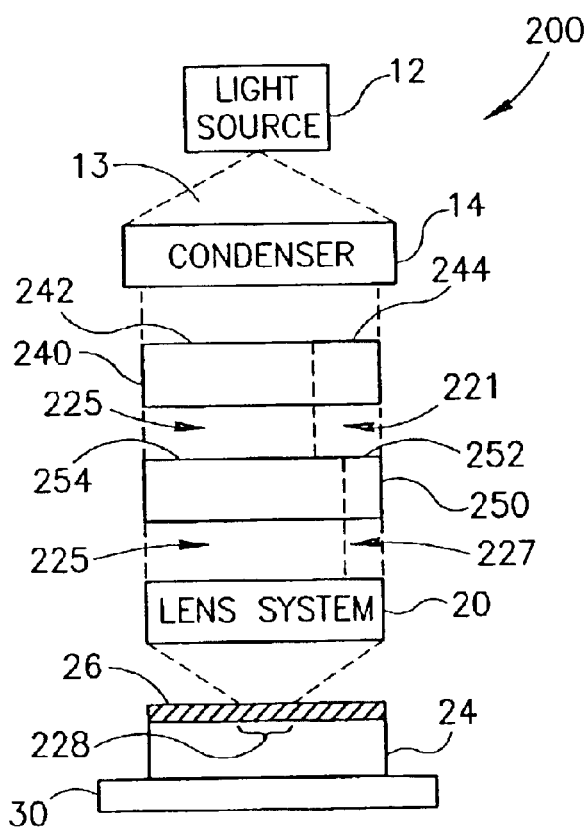
FIG. 10 is a side elevational view of a photolithographic apparatus in accordance with an alternate embodiment of the invention.

FIG. 10 is a side elevational view of a photolithographic apparatus 200 in accordance with an alternate embodiment of the invention. In this embodiment, the photolithographic apparatus 200 includes first and second reticles 240, 250 that are simultaneously positioned between the light source 12 and the lens system 20. The first reticle 240 includes a first patterning portion 242 that creates a first light intensity pattern 225, and a first transparent portion 244 that simply transmits a first transmitted portion 221 of the incident light 13. Similarly, the second reticle 250 includes a second patterning portion 252 and a second transparent portion 254. The first transmitted portion 221 is transmitted onto the second patterning portion 252, created a second light intensity pattern 227, while the first light intensity pattern 225 is merely transmitted through the second transparent portion 254. The thicknesses of the first and second transparent portions 244, 254 may be selected based on the wavelength of the incident light so that the light passing through the transparent portions is not be phase-shifted, thereby preventing destructive interference effects from occurring. The resulting combination of the first and second light intensity patterns 225, 227 is then transmitted through the lens system 20 onto the exposed portion 228 of the photoreactive layer 26.

The photolithographic apparatus 200 provides additional advantages over conventional photolithographic apparatus. As described above, the photolithographic apparatus 200 advantageously allows design variations to be made in a relatively small portion of the exposed area 228 by changing only one of the reticles (e.g. the second reticle 250). The second reticle, being simpler and having a less dense pattern than the first reticle 240, will be relatively inexpensive to replace. In this manner, costs for fabricating reticles over the course of the development can be reduced compared to fabricating a new single reticle having the patterns for the photoreactive layer 26 each time a change is made. Another advantage of the photolithographic apparatus 200 is that the first and second reticles 240, 250 are simultaneously positioned between the light source 12 and the photoreactive layer 26, allowing the resulting exposed portion 228 to be created in a single exposure step, such as with conventional photolithographic techniques.

The detailed descriptions of the above embodiments are not exhaustive descriptions of all embodiments contemplated by the inventors to be within the scope of the invention. Indeed, persons skilled in the art will recognize that certain elements of the above-described embodiments may variously be combined or eliminated to create further embodiments, and such further embodiments fall within the scope and teachings of the invention. It will also be apparent to those of ordinary skill in the art that the above-described embodiments may be combined in whole or in part to create additional embodiments within the scope and teachings of the invention.

Thus, although specific embodiments of, and examples for, the invention are described herein for illustrative purposes, various equivalent modifications are possible within the scope of the invention, as those skilled in the relevant art will recognize. The teachings provided herein can be applied to other apparatus and methods for photolithographic patterning, and not just to the embodiments described above and shown in the accompanying figures. Accordingly, the scope of the invention should be determined from the following claims.

What is claimed is:

1. A method of photolithographically patterning a surface of a substrate, comprising:

forming a photoreactive layer on the surface of the substrate;

transmitting light through a patterning portion of a first photolithographic mask to expose a first portion of the photoreactive layer;

transmitting light through a patterning portion of a second photolithographic mask to expose a second portion of the photoreactive layer, wherein transmitting light through the patterning portion of the first photolithographic mask comprises transmitting light through the patterning portion of the first photolithographic mask simultaneously with transmitting light through the patterning portion of the second photo lithographic mask; and removing at least part of the first and second portions of the photoreactive layer.

2. The method of claim 1, further comprising transmitting light through a transparent portion of the first photolithographic mask simultaneously with transmitting light through the patterning portion of the first photolithographic mask.

3. The method of claim 2 wherein transmitting light through the second patterning portion of the second photolithographic mask comprises transmitting the light through the transparent portion of the first photolithographic mask through the patterning portion of the second photolithographic mask.

4. The method of claim 1, further comprising blocking an unexposed portion of the photoreactive layer from being exposed to light with a blocking portion of the first photolithographic mask simultaneously with transmitting light through the patterning portion of the first photolithographic mask.

5. The method of claim 4 wherein transmitting light through the patterning portion of the second photolithographic mask comprises transmitting light through the second patterning portion of the second photolithographic mask corresponding to the first unexposed portion of the photoreactive layer.

6. The method of claim 1, further comprising:

prior to transmitting light through the patterning portion of the first photolithographic mask, and prior to transmitting light through the patterning portion of the second photolithographic mask, simultaneously positioning the first and second photolithographic masks between a light source and the photoreactive layer.

7. A method of forming a desired pattern on a surface of a substrate, comprising:

forming a photoreactive layer on the surface of the substrate;

positioning a first photolithographic mask having a patterning portion between light source and the photoreactive layer;

transmitting light through the patterning portion of the first photolithographic mask to expose a first portion of the photoreactive layer;

positioning a second photolithographic mask having a patterning portion between the light source and the photoreactive layer;

transmitting light through the patterning portion of the second photolithographic mask to expose a second portion of the photoreactive layer, wherein transmitting light through the patterning portion of the second photolithographic mask comprises transmitting light through the patterning portion of the second photolithographic mask simultaneously with transmitting light through the patterning portion of the first photolithographic mask; and removing at least part of the first and second portions of the photoreactive layer.

8. The method of claim 7 wherein the desired pattern comprises a memory circuit, and wherein transmitting light through the patterning portion of the first photolithographic mask comprises transmitting light through the patterning portion of the first photolithographic mask to expose a memory array portion of the memory circuit, and transmitting light through the patterning portion of the second photolithographic mask comprises transmitting light through the patterning portion of the second photolithographic mask to expose a periphery portion of the memory circuit.

9. The method of claim 7 wherein positioning the first photolithographic mask having the patterning portion between the light source and the photoreactive layer comprises positioning a first photolithographic mask having a first opaque portion, further comprising blocking a first unexposed portion of the photoreactive layer with the first opaque portion of the first photolithographic mask simultaneously with transmitting light through the patterning portion of the first photolithographic mask.

10. The method of claim 9 wherein blocking the first unexposed portion of the photoreactive layer with the first opaque portion of the first photolithographic mask comprises blocking the first unexposed portion of the photoreactive layer coinciding with the second portion of the photoreactive layer.

11. The method of claim 9 wherein positioning the second photolithographic mask having the patterning portion between the light source and the photoreactive layer comprises positioning a second photolithographic mask having a second opaque portion, further comprising blocking a second unexposed portion of the photoreactive layer with the second opaque portion of the second photolithographic mask simultaneously with transmitting light through the patterning portion of the second photolithographic mask.

12. The method of claim 11 wherein blocking the first unexposed portion of the photoreactive layer with the first opaque portion of the first photolithographic mask comprises blocking the first unexposed portion of the photoreactive layer coinciding with the second portion of the photoreactive layer, and wherein blocking the second unexposed portion of the photoreactive layer with the second opaque portion of the second photolithographic mask comprises blocking a second unexposed portion of the photoreactive layer coinciding with the first portion of the photoreactive layer.

13. The method of claim 7 wherein transmitting light through the patterning portion of the second photolithographic mask to expose a second portion comprises transmitting light through the patterning portion of the second photolithographic mask to expose a second portion that partially overlaps with the first portion of the photoreactive layer.

14. The method of claim 7 wherein positioning the first photolithographic mask having the first patterning portion between the light source and the photoreactive layer comprises positioning a first photolithographic mask having a transparent portion, further comprising transmitting light through the transparent portion of the first photolithographic mask simultaneously with transmitting light through the patterning portion of the first photolithographic mask.

15. The method of claim 14 wherein transmitting light through the patterning portion of the second photolithographic mask comprises transmitting light through the transparent portion of the first photolithographic mask through the patterning portion of the second photolithographic mask.

* * * * *